Figure 1:
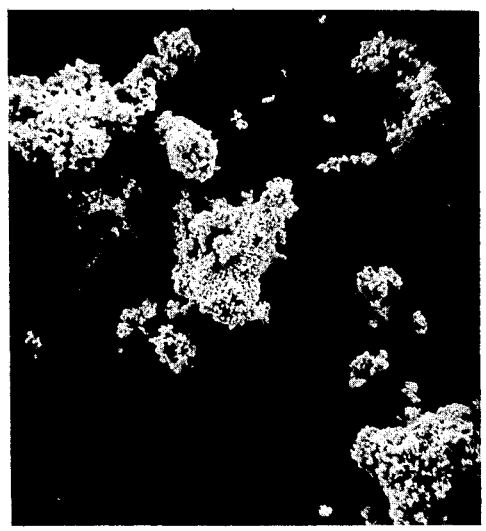

United States Patent [19]

Arendt et al.

[11] 4,152,280

[45] May 1, 1979

[54] MOLTEN SALT SYNTHESIS OF MODIFIED LEAD ZIRCONATE TITANATE SOLID SOLUTION POWDER

[75] Inventors: Ronald H. Arendt; Joseph H. Rosolowski, both of Schenectady, N.Y.

[73] Assignee: General Electric Company, Schenectady, N.Y.

[21] Appl. No.: 896,633

[22] Filed: Apr. 17, 1978

[51] Int. Cl.$^2$ ................... C04B 35/46; C01G 23/00; C04B 35/48
[52] U.S. Cl. .................. 252/62.9; 106/73.3; 423/DIG. 12; 423/598
[58] Field of Search ............ 453/548, DIG. 12; 252/62.9; 106/73.3

[56] References Cited

U.S. PATENT DOCUMENTS

| | | | |
|---|---|---|---|
| 2,841,470 | 7/1958 | Berry et al. | 423/598 |
| 3,666,666 | 5/1972 | Haertling | 252/62.9 |
| 3,708,438 | 1/1973 | Levy | 423/598 |
| 3,760,068 | 9/1973 | Winter et al. | 423/598 |
| 3,793,443 | 2/1974 | Arendt | 423/594 |
| 3,923,675 | 12/1975 | Mazdiyasni et al. | 432/598 |
| 3,963,630 | 6/1976 | Yonezawa et al. | 423/598 |

FOREIGN PATENT DOCUMENTS 765169   10/1971   Belgium ................... 423/598

*Primary Examiner*—Herbert T. Carter
*Attorney, Agent, or Firm*—Jane M. Binkowski; Joseph T. Cohen; Charles T. Watts

[57] ABSTRACT

Sodium chloride and/or potassium chloride is added to an aqueous suspension of the oxides of lead, titanium, zirconium and cationic modifier and stirred until the suspension converts to a gel which is then heated, evaporating the water and melting said chloride in which the oxides dissolve and react precipitating modified lead zirconium titanate.

7 Claims, 2 Drawing Figures

MOLTEN SALT SYNTHESIS OF MODIFIED LEAD ZIRCONATE TITANATE SOLID SOLUTION POWDER

The present invention relates to the preparation of modified or doped lead zirconate titanate (LZT) solid solution powder of predetermined composition or stoichiometry.

Conventionally, modified or doped lead zirconate titanate powder is prepared by the high temperature solid state reaction of appropriate precursor compounds. The reaction product is in the form of relatively large, strong self-bonded particle aggregates which must be comminuted to the desired approximately 1.0 micron particle size before fabrication into ceramic articles.

One of the inadequacies of this conventional procedure is that the product, in commercial practice, is not fully reacted to yield uniform composition on a microscopic level. In cases where the physicochemical properties depend on the composition and its uniformity, the nonuniform composition of the conventional product usually leads to less than optimum properties. Although procedures can be adopted in the conventional process to minimize these variations, the penalty in additional effort generally is considerable.

The comminution portion of the conventional process is also potentially detrimental in that significant, uncontrollable quantities of undesirable impurities can be introduced from the grinding media. Again, extraordinary precautions can be taken to minimize the comminution effects, but with attendant penalties.

The present invention circumvents the inadequacies of the conventional process by substituting for the solid state reaction, a liquid phase reaction scheme utilizing a molten salt solvent with subsequent precipitation of the product which does not require comminution. In the present process, the reactants, and/or their precursors, are slightly soluble in the molten salt solvent, therefore allowing literally atomic mixing in the liquid phase of the reactants. The solubility of the reactants is such that it exceeds the corresponding solubility of the modified lead zirconate titanate in the molten salt solvent. Hence, the observed product precipitates spontaneously from the molten salt solution. The reactants will continually dissolve to maintain a reactant-saturated solution until they are totally consumed by product formation.

Preferably, the reaction temperature in the present process is that required to attain reasonable reaction rates in the molten salt solvent, but it can be significantly lower than in the corresponding conventional solid state synthesis. Similarly, the reaction time can be as short as about 30 minutes or shorter compared with several hours for solid state reaction.

The present process allows the composition of the modified LZT powder to be predetermined and controlled. Since the present modified LZT grains are produced by precipitation, they are chemically homogeneous, i.e. they are of uniform composition on a microscopic level. Also, since the individual modified LZT grains range up to about 1 micron in size and are generally submicron, they do not require any crushing or grinding operations with their attendant contamination with impurities from the equipment employed before they can be fabricated into useful ceramic articles.

Those skilled in the art will gain a further and better understanding of the present invention from the detailed description set forth below, considered in conjunction with the figures accompanying and forming a part of the specification, in which:

FIG. 1 is a photomicrograph (magnified 1000 ×) of aggregates of modified LZT powder produced by the present process which had been formulated to produce the predetermined stoichiometric composition of

Figure 2:
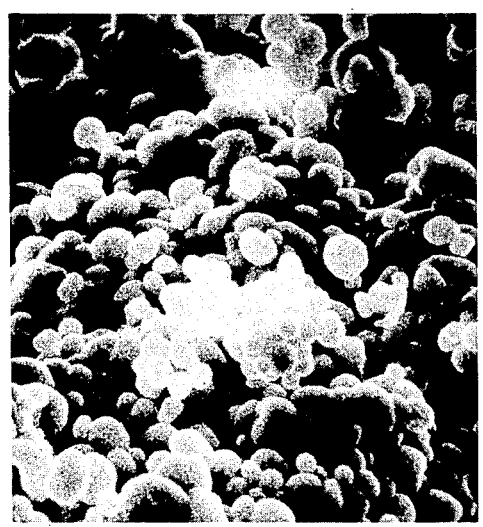

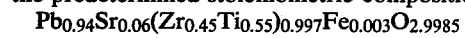
$Pb_{0.94}Sr_{0.06}(Zr_{0.45}Ti_{0.55})_{0.997}Fe_{0.003}O_{2.9985}$
and FIG. 2 is a photomicrograph (magnified 10,000 ×) of one of the aggregates of FIG. 1.

As used herein an oxide of a cationic modifier, or cationic oxide modifier, is a cationic oxide other than the oxides of lead, zirconium and titanium which, in the present process, substitutes its cationic component for a portion of the lead atoms and/or for a portion of the combination $(Zr_xTi_{1-x})$ in the LZT lattice producing a modified LZT powder of predetermined composition, i.e. stoichiometry. Likewise, the term modified lead zirconate titanate, which includes doped lead zirconate titanate, indicates that the cations of the cationic oxide modifier have been substituted in the LZT lattice network for a portion of the lead atoms and/or a portion of the combination $(Zr_xTi_{1-x})$ atoms.

Briefly stated, the present process for producing modified lead zirconate titanate solid solution powder of predetermined composition or stoichiometry comprises providing particulate reactant oxides of zirconium ($ZrO_2$), titanium($TiO_2$), lead (PbO) and cationic modifier in said stoichiometric amounts, admixing said particulate reactant oxides which at least sufficient water with at least sufficient stirring to produce a suspension, adding to said stirred suspension a chloride salt selected from the group consisting of sodium chloride, potassium chloride and mixtures thereof, and maintaining said stirring until the resulting suspension converts to a solid gel, heating said gel to a reaction temperature at least sufficient to melt said chloride salt but below the temperature at which said modified lead zirconate titanate melts, said salt in molten form being a solvent for said reactant oxides of zirconium, titanium, lead and cationic modifier, maintaining said reaction temperature, dissolving and reacting said reactant oxides in said molten salt and precipitating modified lead zirconate titanate, and recovering said precipitated modified lead zirconate. Alternatively, particulate precursors for the reactant oxides can be used.

In the present process, modified LZT solid solution powder of predetermined composition, i.e., stoichiometry, is prepared. Specifically, in the LZT formula $Pb(Zr_xTi_{1-x})O_3$, where x is any value in the range 0.0–1.0, and for forming a useful piezoelectric ceramic has a minimum value of 0.1, the atomic ratio of zirconium to titanium can be varied and it is the same as the ratio of the moles of zirconium oxide to titanium oxide used to produce the LZT powder. The particular ratio of oxides of zirconium and titanium used depends upon the properties which such ratio imparts to the resulting LZT powder, and consequently to the ceramic fired from such powder. In the LZT formula, $Pb(Zr_xTi_{1-x})O_3$, one mole of lead oxide is required for each mole comprised of the oxides of titanium and zirconium. However, when used in these stoichiometric amounts, residual concentrations of zirconium oxide and titanium oxide usually are left in the molten salt, typically in the range of about $10^{-2}$ to $10^{-10}$ mole fraction, due to loss of lead oxide through vaporization. Preferably, to minimize these residual reactant concentrations and to make up the lead oxide vaporization losses, the lead oxide is used in an amount in excess of stoichiometric, i.e. at least about 1 weight % and preferably at least about 2 weight % in excess of stoichiometric. This excess amount of lead oxide drives the reaction towards the formation of LZT, or modified LZT to completion. Any excess lead oxide which may remain is easily removed with an acid such as acetic acid.

In the present process, the reactant oxides are formulated to produce a modified LZT solid solution powder of predetermined composition which may have the following formula:

$$Pb_aM'_b(Zr_xTi_{1-x})_cM''_{1-c}O_{3-d}$$

where M' is a cation that substitutes for a portion of the Pb atoms and M'' is a cation that substitutes for a portion of the combination $(Zr_xTi_{1-x})$ atoms. The values of the subscripts b and c depend on the amount of the M' and M'' cations, respectively, that are present, while the values of the subscripts a and d depend on the valences of M' and M'' relative to Pb, and Zr or Ti. For instance, if M' has the valence +2 and M'' has a valence +4, then a equals 1-b and d equals zero. If either M' or M'' is present alone and has a valence greater then +2 and +4, respectively, then charge balance in the compound is accomplished by creating Pb site vacancies, so d equals zero and a assumes the appropriate value. If M' or M'' is present alone and has a valence less than +2 and +4, respectively, then charge balance is accomplished by generating 0 site vacancies, so a becomes 1-b and d assumes the appropriate value. The effect of M' and M'' on the subscripts in the chemical formula when present in combination is the sum of their effects when present separately.

In the present process, an oxide of a cationic modifier is used to substitute its cationic component in the LZT lattice network to produce a modified LZT powder, and preferably, the substituted cationic component imparts significantly improved electric or piezoelectric properties to the ceramic formed from the modified powder. A plurality of cationic oxide modifiers can be used. The particular cationic oxide modifier used and the amount thereof depends on the properties its cationic component imparts to the specific LZT powder being formulated, for example the particular Zr/Ti ratio and other cationic oxide modifiers in the formulation. Each modifier can be incorporated into LZT powder in an amount up to the limit of its solid solubility in the presence of all other modifiers. The amount of each modifier used in any case depends on the degree of effect desired to be achieved. Ordinarily, however, amounts of cationic oxide modifier significantly higher than about 5% by weight present in the total reactant oxide formulation or composition provide no significant advantage.

Representative of the cationic oxide modifiers useful in the present invention are strontium oxide (SrO), ferric oxide($Fe_2O_3$), niobium oxide($Nb_2O_5$), antimony oxide($Sb_2O_3$), arsenic oxide($As_2O_3$), vanadium oxide($V_2O_5$), tantalum oxide ($Ta_2O_5$), calcium oxide(CaO), magnesium oxide(MgO), chromium oxide($Cr_2O_3$) titanium oxide($TiO_2$) and nickel oxide(NiO).

In carrying out the present process, PbO, $ZrO_2$ and $TiO_2$ are used as reactant oxides. However, any precursor compounds which decompose to form these oxides at or below the reaction temperature may be used. These oxides as well as the reactant oxides or oxide precursors of the cationic modifiers can be of commercial or technical grade, and their particular purity depends largely on the particular application of the resulting modified LZT powder. Specifically, the reactant oxides or oxide precursors should not contain any impurities which would have a significantly deleterious effect on the resulting modified LZT powder or on its particular application.

The particular size of the reactant oxides or oxide precursors, i.e. oxides of lead, zirconium, titanium and cationic modifier should be of a size which is suspendible in water with stirring and which allows the reaction to take place. Generally, the reactant oxides are used in the particle size range in which they are available commercially, which ordinarily ranges from submicron to about 25 microns. The reactant powders should also be free of large, hard aggregates, i.e. about 100 microns or larger in size, which might survive the mixing process and prevent sufficient reactant contact for satisfactory reaction rates.

Water, preferably at room or ambient temperature, is admixed with the particulate reaction oxides in an amount which, with stirring, is at least sufficient to form a slurry, i.e. a complete suspension. Preferably, to insure good contact and complete reaction, the particulate oxides are initially admixed and the water is admixed with the resulting mixture. The particulate oxides can be admixed by a number of techniques which do not introduce undesirable impurities into the resulting modified LZT powder such as, for example, using a ceramic milling medium identical to one of the reactants, or by wet mixing in a high speed blendor with preferably distilled or deionized water, depending on the application of the modified LZT powder. Generally, about 1 liter of water per 1 kilogram of reaction composition or mixture, i.e. particulate oxides of lead, zirconium, titanium and cationic modifier in at least stoichiometric amounts, is satisfactory. Amounts of water significantly in excess of about 1.5 liters per 1 kilogram of reaction mixture provide no significant advantage.

The water and reaction composition or mixture are admixed to suspend the particulate oxides to form a suspension. Vigorous stirring should be employed to obtain a complete suspension. Settled material will generally not react completely. Preferably, such mixing or stirring is carried out with stainless steel or plastic stirrers, for example a propeller, in a stainless steel or plastic, preferably Teflon, lined vessel to prevent introduction of impurities into the suspension.

In the present process the chloride salt is selected from the group consisting of sodium chloride, potassium chloride and mixtures thereof. The chloride salt is added to the stirred suspension, preferably at room or ambient temperature, and stirring of the suspension is continued sufficiently to maintain its homogeneity until it converts to a solid gel. When the chloride salt dissolves in the water, the resulting ions hydrolyze the lead compound. For example, lead oxide is hydrolyzed to the hydroxide while a precursor for lead oxide may be hydrolyzed to the hydroxide or carbonate. The hydrolyzed lead compound converts the suspension to a gel. The resulting gel is not a flowable material but a firm solid gel which cannot be stirred.

The chloride salt solvent is used in a minimum amount of at least about 20% by weight of the total amount of reactant oxides, i.e. reaction mixture, and chloride salt solvent. Amounts of chloride salt lower than about 20% by weight are not practical since the desired reaction will not proceed. There is no upper critical maximum amount of chloride salt, but amounts of chloride salt higher than about 80% by weight of the total amount of reactant oxides and chloride salt solvent provide no significant advantage. As the amount of chloride salt or salt mixture is increased from 20% by weight to about 50% by weight, the amount of individual grains or crystallites present in the resulting modified LZT powder produced increases correspondingly, and with an amount of chloride salt or salt mixture above about 50% by weight, substantially all or all of the modified LZT powder recovered consists essentially of individual grains or crystallites.

The gel is heated in air to a reaction temperature at which the chloride salt is molten. This heating can be carried out in one step, or if desired in two steps, and preferably, it is carried out in a vessel lined with a material which does not introduce impurities or significant impurities into the reaction mixture depending on the purity desired in the modified LZT powder. Frequently, it is more practical to heat the gel, for example at a temperature from about 373° K.(100° C.) to about 498° K.(225° C.), in a suitable vessel such as a Teflon-lined vessel, to evaporate the water therefrom producing a cake or cake-like product wherein the particles are maintained in intimate contact, and which, being smaller in volume than the gel, can be more conveniently transferred to a reaction vessel suitable for the higher temperatures required for reaction, such as platinum or platinum lined or stabilized zirconia crucibles.

The particular reaction temperature used depends largely on the chloride salt used and reaction rate desired, i.e. rate of precipitation of the modified lead zirconium titanate desired. In molten form, the present chloride salt is a solvent for the reactant oxides, and the minimum reaction temperature is the temperature at which the chloride salt or salt mixture melts. For sodium chloride alone it is about 1073° K.(800° C.) whereas for potassium chloride alone it is about 1063° K.(790° C.). All mixtures of sodium chloride and potassium chloride form a mixture which melts at a temperature below the melting point of the sodium chloride salt alone, and thus, for the eutectic mixture of 50 mole % potassium chloride - 50 mole % sodium chloride the minimum reaction temperature is 931° K.(658° C.). Preferably, in the present invention, the minimum reaction temperature is at least about 10° K. above the melting point of the chloride salt or salt mixture since such a temperature insures complete melting of chloride salt and also increases the fluidity of the molten salt producing increased wetting of the reaction mixture. However, the maximum reaction temperature is always below the melting point of the modified lead zirconate titanate being precipitated which is approximately 1623° K.(1350° C.) but which may vary somewhat depending upon the particular composition of the particular modified LZT precipitate. Particularly preferred is a reaction temperature ranging from about 1173° K.(900° C.) to about 1373° K.(1100° C.) since it is not difficult to maintain and provides high reaction rates without significant vaporization of the molten salt solvent.

At the reaction temperature, the chloride salt melts, and the oxides dissolve and react in the molten salt precipitating the modified lead zirconate titanate. The reaction temperature is maintained until the reaction is completed. The particular period of reaction time depends largely on reaction temperature as well as the amount of chloride salt used and is determinable empirically. When the reaction is completed, the reacted mass is cooled at any convenient rate, preferably in air and preferably to about room temperature.

The cooled modified LZT-containing reacted mass is a solid, brick-like to texture and hardness, comprised of the modified LZT particles distributed through a matrix of solidified chloride salt. Water, preferably distilled or deionized to prevent introduction of impurities and preferably at room temperature, is added to the solid reacted mass in an amount at least sufficient to dissolve the chloride salt content therefrom. The solubility of the present chloride salt is about 0.3 kilogram per liter of water at room temperature. This dissolution preferably is carried out in a plastic vessel, and as a practical matter with mixing to substantially shorten dissolution time, using, for example, a motor driven plastic or stainless steel stirrer. As the chloride salt dissolves, the solid mass disintegrates leaving a fine modified LZT powder that contains no perceptibly agglomerated material, i.e. perceptible to the eye.

The modified LZT powder can be recovered from the aqueous supernatant chloride solution by a number of techniques. For example, the modified LZT powder can be recovered by decanting the supernatant solution and drying the modified LZT powder in air. The particular recovery technique depends on the impurities which may be present, such as excess lead when lead oxide is initially used in excess amount, and on the purity required in the ceramic fabricated from the powder. Specifically, the supernatant solution will have a high ionic strength which will cause the modified LZT powder to flocculate and settle when mixing is stopped. The supernatant can therefore be nearly quantitatively decanted to allow repeated washings of the modified LZT powder with distilled water. Preferably, washing of the modified LZT powder should be repeated with distilled water in an amount just sufficient to form a thin slurry or suspension with the powder until a stage is reached where the supernatant will remain milky white after about 10 minutes of settling, indicating cessation of flocculation. At this point the residual chlorine ion concentration is low enough in the supernatant solution so as not to interfere with the removal of excess lead if present. Excess lead can then be removed conveniently by adding enough of a concentrated acid subsequently removable by heat, preferably acetic acid, to make the slurry acidic. Preferably, the modified LZT slurry is made about 1.0 Molar acidic, and for example, this requires about 4 liters of 1 Molar acetic acid per 1 kilogram of modified powder. The resulting slurry preferably is mixed at room temperature in air for about 30 to 60 minutes. The color of the modified LZT powder during such mixing should lighten due to dissolution of the excess lead oxide added initially. Mixing is then discontinued and a flocculating agent which is organic and soluble in water, preferably an anionic flocculant, is added in an amount which is sufficient to flocculate and settle the modified LZT powder. After several washings and settlings, the wet powder is dried. Preferably, the flocculating agent is added in aqueous solution, about 0.1 gram of flocculant per 100 grams of water usually being satisfactory, and preferably the flocculating agent is used only in an amount necessary to settle the powder. For production of modified LZT powder of high purity, the floocculating agent should be completely removable by heating the powder in air at temperatures below the melting point of the powder and preferably not higher than about 1073° K.(800° C.). Preferably, to remove any remaining water, acetic acid and flocculant, it is heated at about 773° K.(500° C.) for about 20 minutes.

In the present process, if desired, a particulate inorganic or organic precursor of any of the oxides of lead, titanium, zirconium or cationic modifier can be used, i.e. substituted for the particulate oxide. The precursor should be of a size suspendible in water with mixing. The precursor should be a solid at room temperature, and at or below the reaction temperature used, it should decompose completely to form the oxide and by-product gas or gases leaving no contaminants in the reacted mass. Representative of the precursors of any of the oxides of lead, titanium, zirconium or cationic modifier useful in the present process are the carbonates, hydroxides and nitrates. The precursor should be used in an amount sufficient to produce the respective oxide in at least the stoichiometric amount.

Depending on the cationic modifier or modifiers used, the present modified LZT powder ranges in color from pale yellow to brown, and the lighter colored powder may darken on exposure to light to a tan color. The powder is free-flowing and can be in the form of aggregates or in the form of the individual powder grains, but usually it is a mixture of both. The aggregates which ordinarily range in size from about 1 micron to about 20 microns, are particles consisting essentially of a cluster of smaller sized particles or grains weakly bonded together autogeneously, i.e. such bonding is believed to be caused by Van der Waal's forces or by self-bonding, i.e. small necks between grains. The individual powder grains range up to about 1 micron in size and usually are submicron. The aggregates are friable and readily break down to the individual grains during subsequent pressing into a green body.

The grains have a smooth surface and a curvilinear contour of substantially spheroidate shape. In addition, the grains are characterized by the absence of exterior fracture-induced planar surfaces and sharp protuberant angles.

X-ray diffraction analysis of the as-produced modified LZT powder shows no phase other than lead zirconate titanate. It also shows that the peaks in the powder patterns are not sharp indicating that the powder is not well crystallized, i.e. it has a considerable degree of crystal disordering present. However, when the powder is pressed and fired into a ceramic, X-ray diffraction patterns of powder crushed from the ceramic show sharp lines indicating a well crystallized material.

The present modified LZT powder can be prepared fully reacted and free of impurities or free of significant impurities. Therefore, its properties are reproducible from batch to batch. Specifically, when the same procedure is used for preparing batches of the modified LZT powder and also for fabricating these batches into ceramic bodies, the electric an piezoelectric properties of the ceramic bodies are reproducible, typically within ±4%. In contrast, the reproducibility of electric and piezoelectric properties of ceramics fabricated from conventional solid state reaction modified LZT powder typically ranges within ±10%.

The present modified LZT powder is useful for producing ceramic bodies having a variety of applications. Because of their electric and piezoelectric properties, a majority of the ceramic bodies produced are particularly useful as transducers.

A number of techniques can be used to fabricate the present modified LZT powder into a useful ceramic body. Specifically, the modified LZT powder is pressed into a green body of desired size and shape and fired at a temperature below its melting point of approximately 1623° K.(1305° C.)to produce a fired body, i.e. polycrystalline ceramic body, having a density of at least about 7000 Kg m$^{-3}$.

A number of techniques can be used to shape the modified LZT powder into a green body, preferably using shaping tools and techniques that do not introduce impurities or any significant impurities into the powder. For example, the powder can be extruded, injection molded, die-pressed, isostatically pressed or slip cast to produce the green body of desired shape. Any lubricants, binders or similar materials used in faciliating shaping the powder should have no significant deteriorating effect on the properties desired in the ceramic fired therefrom. Such materials are preferably of the type which evaporate on heating at relatively low temperatures, preferably below 473° K.(200° C.), leaving no significant residue. The green body should have a density of at least about 4000 Kg m$^{-3}$, and preferably at least about 5000 Kg m$^{-3}$ or higher, to promote densification during firing.

Firing of the green body is carried out at atmospheric pressure at a temperature preferably ranging from about 1373° K.(1100° C.) to about 1548° K.(1275° C.) in air or in an oxygen-enriched sintering atmosphere, and preferably in oxygen. Firing shrinks, i.e. densifies, the green body into a fired polycrystalline body, i.e. ceramic which generally ranges in density from about 7500 Kg m$^{-3}$ to about 7900 Kg m$^{-3}$. The period of time for firing is determinable empirically and depends largely on the final density desired as well as oxygen content of the sintering atmosphere and sintering temperature. The rate of densification increases with increasing oxygen content in the firing atmosphere and also with increasing firing temperature.

The invention is further illustrated by the following examples wherein the procedure was as follows unless otherwise stated:

Lead oxide, PbO, (reagent grade, >99% pure), titanium oxide, TiO$_2$, (reagent grade, >99% pure) and zirconium oxide, ZrO$_2$, (reactor grade, 99.5% pure) powders were used.

All of the oxides or oxide precursors of the cationic modifiers were powders of reagent grade >99% pure.

A complete suspension of the oxide or precursor for the oxide particles in water was obtained with stirring and the oxide or precursor particles in suspension ranged from submicron up to about 25 microns.

A mixture of 0.45 kilogram sodium chloride and 0.45 kilogram of potassium chloride was used.

About 1000 grams of modified LZT powder were produced. The powder was light yellow in color, free-flowing and did not have any perceptible aggregates, i.e. perceptible to the eye. On exposure to light, however, the exposed portions of the powder turned to a light tan.

The bulk density of each pressing or green body was determined from its weight and dimensions.

Density of the fired product was determined by water displacement using Archimedes method or from its weight and dimensions.

EXAMPLE 1

In this example a modified lead zirconate titanate powder was prepared to produce the predetermined composition of

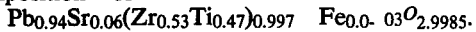
$Pb_{0.94}Sr_{0.06}(Zr_{0.53}Ti_{0.47})_{0.997} Fe_{0.0-03}O_{2.9985}$.

685.4 grams PbO, 116.8 grams of $TiO_2$, 202.0 grams of $ZrO_2$ and 27.6 grams of strontium carbonate ($SrCO_3$) and 0.75 grams of $Fe_2O_3$ were admixed with ~1.5 liters of distilled $H_2O$ in a plastic vessel provided with a motor driven plastic coated steel propeller. The resulting mixture was stirred at the rate of 1000-3000 rpm, and the vigorous stirring produced a complete suspension of all the particles which ranged from submicron size up to about 25 microns in the water. This stirring was continued maintaining all of the particles in suspension while a mixture of 0.45 kilogram of NaCl and 0.45 kilogram of KCl was added to the stirred suspension. Stirring was maintained and in about 15 minutes the stirred suspension gelled completely forming a solid gel which could not be stirred.

This gel was placed in a Teflon-lined vessel and heated in air at 473° K.(200° C.) for about 15 hours (overnight) whereby its water content was evaporated leaving a dried cake about one-half the size of the gel.

The dried cake was placed in a platinum-lined vessel and covered loosely with a platinum-lined cover to prevent introduction of impurities and placed into an air furnace pre-heated to the reaction temperature of 1273° K.(1000° C.). After about 60 minutes at 1273° K.(1000° C.), the vessel was removed from the furnace and allowed to cool to room temperature.

The reacted product was brick-like in texture and hardness. It was placed in about 4.2 liters of distilled water in a plastic vessel provided with a motor driven plastic coated stainless steel stirrer. After 30 minutes of stirring, the brick-like cake product disintegrated completely into a fine powder that contained no visually perceptible aggregated material.

When stirring was stopped, the powder flocculated and settled completely, and the supernatant solution was decanted. The powder was then washed about four times with distilled water until the supernatant remained milky white after about 10 minutes of settling time indicating cessation of flocculation and complete or almost complete removal of chloride ion.

4.2 liters of dilute 1 Molar acetic were added to the slurry making the slurry 1.0 Molar acid. Mixing of the resulting slurry was continued at room temperature for 30 minutes during which time the color of the powder lightened, i.e. became a lighter yellow, due to dissolution of the excess lead which had been added initially as lead oxide.

An aqueous flocculating solution comprised of 0.02 gram of anionic flocculant (a polyamide imide powder sold under the trademark Hercaloc 821) in 20 grams of distilled water was then added to the stirred slurry. The powder was allowed to settle and the supernatnat was then decanted. The acetic acid treatment, flocculation and decantation was repeated twice.

The resulting modified LZT powder was then washed with dilute acetic acid ($1 \times 10^{-3}$ M), flocculated with the aqueous flocculating solution and the supernatant decanted, and this step was done five times. The resulting wet powder was dried by heating in air at 423° K.(150° C.). The dried modified LZT powder was then heated in air at about 773° K.(500° C.) for about 3 hours to remove any remaining water, acid and flocculant.

About 1000 grams of modified LZT powder were recovered. The powder was light yellow in color, free-flowing and did not have any perceptible aggregates, i.e. perceptible to the eye. On exposure to light the exposed portions of the powder turned to a light tan.

X-ray diffraction analysis of a portion of the powder showed no phase other than lead zirconate titanate, the breadth of the diffraction peaks indicated the existence of disorder in the crystal structure.

The modified powder was pressed into a green body and fired. Specifically, stearic acid, as a pressing lubricant, was incorporated into the modified LZT powder in an amount of 2% by weight of the powder. Specifically, the stearic acid was dissolved in benzene, the resulting solution added to the powder, and the mixture milled at room temperature for about 24 hours in a polyethylene jar using stabilized zirconia balls. This procedure broke down any large aggregates.

The milled mixture was poured into an open beaker and the benzene evaporated by applying heat. The powder was stirred constantly during drying to prevent stratification or segregation of the stearic acid in the powder as its solvent evaporated. The dry powder was then passed through a 60 mesh screen after which it was ready for pressing.

A cemented carbide die (sold under trademark Carboloy) of 2.54 cm diameter was used for pressing and for preparing each sample. Specifically, about 5 grams of powder were loaded and pressed at 69 MPa (10 Kpsi) holding 1 minute at pressure. This yielded a green body of about 2.5 mm thickness. In order to insure uniform density, these green discs were then placed in a rubber bag, immersed in oil, and isostatically pressed at around 340 MPa (50 Kpsi). The densities of the resulting green bodies were found to be around 5700 Kg m$^{-3}$.

After pressing, the stearic acid binder was burned out of all the green disks by laying them on a powder of their own composition spread on a stabilized zirconia plaque and firing uncovered in air for 1 hour at 873° K.(600° C.). The fractional weight loss during this step was within the experimental uncertainty of the amount of stearic acid lubricant added to the powder.

To carry out the final firing, the green disks were placed in a stack of 5 to 6 in a stabilized zirconia crucible. Loose modified LZT powder of the same composition as the disks was placed under, around and over the stack as well as between the individidual disks. The crucible was then covered with an alumina disk. All of the alumina and zirconia ware was "seasoned" before first being used to fire the disks by being used to fire loose LZT powder only.

A number of the final firings were carried out in a box type furnace having a working space of dimensions approximately 10 cm × 13 cm × 25 cm. The disks were heated at a rate of 125° K./hr to a firing temperature of 1598° K.(1325° C.), held there for one hour, then the power was cut-off and the fired disks allowed to furnace cool (overnight). Oxygen was bled into the furnace during the entire firing cycle. The resulting fired disks had densities typically of about 7500 to 7600 Kg/m$^3$.

A number of the final firings were also carried out in a small tube furnace where the atmosphere was definitely established at 100% oxygen. The disks were heated at a rate of 125° K./hr to a firing temperature of 1598° K.(1325° C.), held there for one hour, then the power was cut-off and the fired disks allowed to furnace cool (overnight). The fired disks had densities around 7700 $Kg/m^3$. It appears, therefore, that the atmosphere in the box furnace during firing probably contained a significant amount of nitrogen from air leaking into it.

The average grain size in all of the fired disks was about 4 $\mu$m.

A number of the fired disks, i.e. polycrystalline ceramic bodies, were tested for their electric and piezoelectric properties.

The poling procedure used was to apply fired-on silver paste electrodes to the disks and to pole them at 393° K.(120° C.) in a bath of a fluorinated hydrocarbon (sold under the trademark Fluorinert) using a field of 2.36 MV/m (60 V/mil). The field was applied for 3 periods of 5 minutes each with a reversal of direction after each of the first 2 periods. Dielectric constant and dissipation factor (loss tangent) at 1 KHz were measured using a 1615 Capacitance Bridge. The planar coupling coefficient was measured using the resonance technique disclosed in IRE Standards on Piezoelectric Crystals: Measurements of Piezoelectric Ceramics, 1961. Proc. IRE (Inst. Radio Engrs.), 49, pp. 1161-69(1961). The piezoelectric $d_{33}$ factor was measured with a Berlincourt Piezo $d_{33}$ Meter, and the mechanical Q factor was calculated from the resonance measurements as described in "Piezoelectric Ceramics", B. Jaffe, W. Cook, Jr. and H. Jaffe, Academic Press, London and New York, 1971.

The average results of these measurements made on three of the fired disks which had been fired in the box type furnace are given in Table I. The values shown are those obtained about 10 days after poling except for the aging rates, which were calculated from data obtained over about 40 days. The results indicate that the ceramic has a high mechanical Q value and low dielectric losses under both low and high field conditions. Its properties are such as to make it particularly useful for fabrication transducers intended to be driven at high power, such as in high power sonar applications.

TABLE I

| Density | 7570 $Kg/m^3$ |
|---|---|
| Dielectric constant(1KHz) | 1200 |
| Tan δ (low field) | .002 |
| Planar coupling coefficient $-k_p$ | 0.52 |
| Mechanical Q | 1700 |
| $d_{33}$ | $250 \times 10^{-12}$ C/N |
| % Change in dielectric constant per time decade | −3.5 |
| % Change in planar coupling per time decade | −2.0 |
| Tan δ at $3.9 \times 10^2$ KV/m | 0.01 |
| % Change in dielectric constant at 3.9 c $10^2$ KV/m | 4.5 |

EXAMPLE 2

In this example a modified lead zirconate titanate powder was prepared as in Example 1 to produce the predetermined composition.

$Pb_{0.94}Sr_{0.06}(Zr_{0.53}Ti_{0.47})_{0.997}Fe_{0.003}O_{2.9985}$.

This powder was prepared in the same manner as set forth in Example 1 except that 115.8 grams of $TiO_2$, 202.0 grams of $ZrO_2$, 27.6 grams of $SrCO_3$ and 0.72 grams of $Fe_2O_3$ were admixed with ~0.5 liters of distilled water and comminuted in a stainless steel blendor at room temperature for about 60 seconds producing a substantially uniform mixture. This mixture was put, along with 685.4 grams of PbO and an additional 1 liter of distilled water at room temperature, into a plastic vessel provided with a motor driven plastic coated steel propeller and stirred to produce a complete suspension of all the particles which ranged from submicron size up to about 25 microns.

About 1000 grams of modified LZT powder were produced. The powder was light yellow in color, free-flowing and did not have any perceptible aggregates, i.e. perceptible to the eye. On exposure to light, however, the exposed portions of the powder turned to a light tan.

X-ray diffraction analysis of a portion of the modified LZT powder showed no phase other than lead zirconate titanate, and the breadth of the diffraction peaks indicated the existence of disorder in the crystal structure.

The modified powder was pressed into green disks and fired as set forth in Example 1. Five of the fired disks had an average density of 7540 $Kg/m^3$. The fired disks were poled and tested at low field for their electric and piezoelectric properties in the same manner as disclosed in Example 1. The results are given in Table II and indicate that an improvement in properties results from including the step of putting the powder slurry through a blending step.

TABLE II

| Dielectric constant(1KHz) | 1260 |
|---|---|
| Tan δ (1KHz) | 0.002 |
| Planar coupling coefficient | 0.522 |
| $d_{33}$ | $267 \times 10^{-12}$ C/N |

EXAMPLES 3-12

Ten compositions of modified LZT powder are listed in Table III as Examples 3-12. These compositions were prepared as set forth in Example 1 except that the quantities of reactant powder were proportionally adjusted in each example so as to produce 1 Kg of modified LZT powder of the indicated composition. The modified LZL powder was mixed with pressing lubricant, pressed into disks, fired into dense ceramics in a box furnace as described in Example 1 and poled as set forth in Example 1. The measured values of the dielectric constant and planar coupling coefficient one hour after poling are also listed in Table III.

TABLE III

| Ex. | Composition | Dielectric Constant (1KHz) | Planar Coupling Coefficient |
|---|---|---|---|
| 3 | $Pb_{.94}Sr_{.06}(Zr_{.56}Ti_{.44})_{.997}Fe_{.003}O_{2.9985}$ | 610 | .480 |
| 4 | $Pb_{.94}Sr_{.06}(Zr_{.55}Ti_{.45})_{.997}Fe_{.003}O_{2.9985}$ | 780 | .520 |
| 5 | $Pb_{.94}Sr_{.06}(Zr_{.54}Ti_{.46})_{.997}Fe_{.003}O_{2.9985}$ | 1240 | .560 |
| 6 | $Pb_{.94}Sr_{.06}(Zr_{.52}Ti_{.48})_{.997}Fe_{.003}O_{2.9985}$ | 1270 | .500 |
| 7 | $Pb_{.94}Sr_{.06}(Zr_{.51}Ti_{.49})_{.997}Fe_{.003}O_{2.9985}$ | 1140 | .460 |
| 8 | $Pb_{.94}Sr_{.06}(Zr_{.05}Ti_{.50})_{.997}Fe_{.003}O_{2.9985}$ | 1030 | .410 |
| 9 | $Pb_{.94}Sr_{.06}(Zr_{.49}Ti_{.51})_{.997}Fe_{.003}O_{2.9985}$ | 850 | .330 |
| 10 | $Pb_{.94}Sr_{.06}(Zr_{.48}Ti_{.52})_{.997}Fe_{.003}O_{2.9985}$ | 780 | .260 |
| 11 | $Pb_{.94}Sr_{.06}(Zr_{.47}Ti_{.53})_{.997}Fe_{.003}O_{2.9985}$ | 690 | .200 |
| 12 | $Pb_{.94}Sr_{.06}(Zr_{.45}Ti_{.55})_{.997}Fe_{.003}O_{2.9985}$ | — | — |

Examples 3-12 illustrate the present invention and show how the properties of the ceramic can be modified or be optimized by modifying the composition of the modified LZT powder.

A portion of the powder produced in Example 12 is shown in FIGS. 1 and 2. FIG. 1 illustrates the aggregates present in the powder. FIG. 2 shows one of the aggregates of FIG. 1. Specifically, FIG. 2 shows an aggregate composed of a cluster of grains wherein the grains have a smooth surface and a curvilinear contour of substantially spheroidate shape. In addition, the grains are characterized by the absence of exterior fracture-induced planar surfaces and sharp protuberant angles.

EXAMPLES 13-15

In Examples 13-15, $ZrO_2$, $TiO_2$ and $SrCO_3$ reactant powders were mixed in the proportions required so that the resulting mixture, after complete reaction with the stoichiometric amount of PbO, would have produced 1000 grams of modified LZT powder having the predetermined composition shown in Table IV. Specifically, in each example, with the resulting mixture of $ZrO_2$, $TiO_2$ and $SrCO_3$ there was admixed 10 grams of $Nb_2O_5$, an amount of PbO equal to the stoichiometric amount for each LZT composition, plus sufficient additional PbO to completely react with the $Nb_2O_5$ to form $PbNb_2O_6$, plus 2 weight % of the total of the previous two additions of PbO. The procedure used to produce the reacted, modified LZT from the mixed reactant powders in each Example was the same as that set forth in Example 1.

The modified powder was pressed into green disks, fired in a box type furnace and poled as set forth in Example 1. Measurements were made on representative samples in the manner described in Example 1 except that the piezoelectric constant $d_{31}$ was obtained from measurements of the planar coupling coefficient, dielectric constant, fundamental planar resonance frequency and the density of the disk as described in "Piezoelectric Ceramics", B. Jaffe, W. Cook Jr. and H. Jaffe, Academic Press, London and New York, 1971. Table IV lists the values obtained for the density, dielectric constant ($K_{33}$), planar coupling coefficient ($k_p$), loss tangent (Tan $\delta$), the piezoelectric constant $d_{31}$ and the mechanical Q value ($Q_m$).

EXAMPLES 16-18

In Examples 16-18, $ZrO_2$, $TiO_2$ and $SrCO_3$ reactant powders were mixed in the proportions required so that the resulting mixture after complete reaction with the stoichiometric amount of PbO would have produced 1000 grams of the modified LZT powder having the predetermined composition shown in the column labelled "Composition" in Table V. Specifically, in each example with the resulting mixture of $ZrO_2$, $TiO_2$ and $SrCO_3$ there was admixed 11 grams of $Sb_2O_3$, an amount of PbO equal to the stoichiometric amount for each LZT composition, plus sufficient additional PbO to completely react with the $Sb_2O_3$ to form $PbSb_2O_6$ or $PbSb_2O_4$, plus 2 weight percent of the total of the previous two additions of PbO. The procedure used to produce the reacted, modified LZT from the mixed reactant powders in each example was the same as that set forth in Example 1.

The modified powder was pressed into green disks, fired in a box type furnace and poled as set forth in Example 1. Measurements were made on representative samples in the manner described in Example 1 except that the piezoelectric constant $d_{31}$ was obtained from measurements of the planar coupling coefficient, dielectric constant, fundamental planar resonance frequency and the density of the disk in the same manner as in Examples 13-15. Table V lists the values obtained for the density, dielectric constant ($K_{33}$), planar coupling coefficient ($k_p$), loss tangent (Tan $\delta$), the piezoelectric constant $d_{31}$ and the mechanical Q value ($Q_m$).

TABLE V

| Ex. | Composition | Density Kg/m$^3$ | $K_{33}$ (1KH$_z$) | $k_p$ | Tan $\delta$ (1KH$_z$) | $-d_{31}$ CN $\times 10^{-12}$ | $Q_m$ |
|---|---|---|---|---|---|---|---|
| 16 | Pb$_{.95}$Sr$_{.05}$(Zr$_{.52}$Ti$_{.48}$)O$_3$ + 1.1 w/o Sb$_2$O$_3$ | 7570 | 1260 | .308 | .011 | 61 | 185 |
| 17 | Pb$_{.95}$Sr$_{.05}$(Zr$_{.54}$Ti$_{.48}$)O$_3$ + 1.1 w/o Sb$_2$O$_3$ | 7550 | 1807 | .385 | .014 | 106 | 151 |
| 18 | Pb$_{.95}$Sr$_{.05}$(Zr$_{.56}$Ti$_{.48}$)O$_3$ + 1.1 w/o Sb$_2$O$_3$ | 7610 | 988 | .268 | .023 | 51 | 121 |

Examples 16-18 illustrate the present invention and show how the properties of the ceramic can be modified or be optimized by modifying the composition of the LZT powder.

The results in Table V indicate that ceramics in the composition range covered in Examples 16-18 would

TABLE IV

| Ex. | Composition | Density Kg/m$^3$ | $K_{33}$ (1KH$_z$) | $k_p$ | Tan $\delta$ (1KH$_z$) | $-d_{31}$ C/N $\times 10^{-12}$ | $Q_m$ |
|---|---|---|---|---|---|---|---|
| 13 | Pb$_{.95}$Sr$_{.05}$(Zr$_{.52}$Ti$_{.48}$)O$_3$ + 1 w/o Nb$_2$O$_5$ | 7300 | 1343 | .388 | .008 | 84 | 280 |
| 14 | Pb$_{.95}$Sr$_{.05}$(Zr$_{.54}$Ti$_{.46}$)O$_3$ + 1 w/o Nb$_2$O$_5$ | 7350 | 1788 | .468 | .009 | 127 | 248 |
| 15 | Pb$_{.95}$Sr$_{.05}$(Zr$_{.52}$Ti$_{.48}$)O$_3$ + 1 w/o Nb$_2$O$_5$ | 7330 | 1135 | .399 | .02 | 86 | 142 |

Examples 13-15 illustrate the present invention and show how the properties of the ceramic can be modified or be optimized by modifying the composition of the LZT powder.

The results in Table IV indicate that ceramics in the composition range covered in Examples 13-15 would be useful, for instance, in strain sensing devices such as hydrophones.

be useful for instance, in strain sensing devices such as hydrophones.

EXAMPLES 19-21

In Examples 19-21, $ZrO_2$, $TiO_2$ and $SrCO_3$ reactant powders were mixed in the proportions required so that the resulting mixture, after complete reaction with the stoichiometric amount of PbO, would have produced 1000 grams of modified LZT powder having the predetermined composition shown in the column labelled "Composition" in Table VI. Specifically, in each example, with the resulting mixture of $ZrO_2$, $TiO_2$ and $SrCO_3$, there was admixed 16.6 grams of $Ta_2O_5$, an amount of PbO equal to the stoichiometric amount for each LZT composition, plus sufficient additional PbO to completely react with the $Ta_2O_5$ to form $PbTa_2O_6$, plus 2 weight percent of the total of the previous two additions of PbO. The procedure used to produce the reacted, modified LZT from the mixed reactant powders in each example was the same as that set forth in Example 1.

The modified powder was pressed into green disks, fired in a box furnace and poled as set forth in Example 1. Measurements were made on representative samples in the manner described in Example 1 except that the piezoelectric constant $d_{31}$ was obtained from measurements of the planar coupling coefficient, dielectric constant, fundamental planar resonance frequency and the density of the disk in the same manner as in Examples 13–15. Table VI lists the values obtained for the density, dielectric constant ($K_{33}$), planar coupling coefficient ($k_p$), loss tangent (Tan δ), the piezoelectric constant $d_{31}$ and the mechanical Q value ($Q_m$).

TABLE VI

| Ex. | | Density Kg/m³ | $K_{33}$ (1KHz) | $k_p$ | Tan δ (1KHz) | $-d_{31}$ C/N × 10⁻¹² | $Q_m$ |
|---|---|---|---|---|---|---|---|
| 19 | $Pb_{.95}Sr_{.05}(Zr_{.52}Ti_{.48})O_3$ + 1.66 w/o $Ta_2O_5$ | 7550 | 1160 | .287 | .006 | 57 | 396 |
| 20 | $Pb_{.95}Sr_{.05}(Zr_{.54}Ti_{.46})O_3$ + 1.66 w/o $Ta_2O_5$ | 7630 | 1534 | .412 | .008 | 99 | 275 |
| 21 | $Pb_{.95}Sr_{.05}(Zr_{.56}Ti_{.44})O_3$ + 1.66 w/o $Ta_2O_5$ | 7640 | 962 | .498 | .011 | 95 | 161 |

Examples 19–21 illustrate the present invention and show how the properties of the ceramic can be modified or be optimized by modifying the composition of the LZT powder.

The results in Table VI indicate that ceramics in the composition range covered in Examples 19–21 would be useful, for instance, in strain sensing devices such as hydrophones.

EXAMPLES 22–30

In Examples 22–30, shown in Table VII, $ZrO_2$, $TiO_2$ and $SrCO_3$ reactant powders were mixed in the proportions required so that the resulting mixture, after complete reaction with the stoichiometric amount of PbO, would have produced 1000 grams of modified LZT powder having the predetermined composition shown in the column labelled "Composition" in Table VII. Specifically, in each example, with the resulting mixture of $ZrO_2$, $TiO_2$ and $SrCO_3$, there was admixed the amount of either $As_2O_3$, $Bi_2O_3$ or $V_2O_5$ shown in the column labelled "Additive" in Table VII, along with an amount of PbO equal to the stoichiometric amount for each LZT composition, plus sufficient additional PbO to completely react with the added $As_2O_3$ to form $PbAs_2O_6$, or $PbAs_2O_4$, or with the added $Bi_2O_3$ to form $PbBi_2O_6$ or $PbBi_2O_4$, or with the added $V_2O_5$ to form $PbV_2O_6$, plus 2 weight percent of the total of the previous two additions of PbO. The procedure used to produce the reacted, modified LZT from the mixed reactant powders in each Example was the same as that set forth in Example 1.

TABLE VII

| Ex. | Composition | Additive | Density Kg/M³ |
|---|---|---|---|
| 22 | $Pb_{.95}Sr_{.05}(Zr_{.52}Ti_{.48})O_3$ | 7.46 gm $As_2O_3$ | 7070 |
| 23 | $Pb_{.95}Sr_{.05}(Zr_{.54}Ti_{.46})O_3$ | 7.46 gm $As_2O_3$ | 7070 |
| 24 | $Pb_{.95}Sr_{.05}(Zr_{.56}Ti_{.44})O_3$ | 7.46 gm $As_2O_3$ | 6440 |
| 25 | $Pb_{.95}Sr_{.05}(Zr_{.52}Ti_{.48})O_3$ | 17.64 gm $Bi_2O_3$ | 7620 |
| 26 | $Pb_{.95}Sr_{.05}(Zr_{.54}Ti_{.46})O_3$ | 17.64 gm $Bi_2O_3$ | 7560 |
| 27 | $Pb_{.95}Sr_{.05}(Zr_{.56}Ti_{.44})O_3$ | 17.64 gm $Bi_2O_3$ | 7580 |
| 28 | $Pb_{.95}Sr_{.05}(Zr_{.52}Ti_{.48})O_3$ | 6.81 gm $V_2O_5$ | 7200 |
| 29 | $Pb_{.95}Sr_{.05}(Zr_{.54}Ti_{.46})O_3$ | 6.81 gm $V_2O_5$ | 7320 |
| 30 | $Pb_{.95}Sr_{.05}(Zr_{.56}Ti_{.44})O_3$ | 6.81 gm $V_2O_5$ | 7400 |

The powders produced in Examples 22–30 were pale yellow in color and did not have any perceptible aggregates, i.e. perceptible to the eye.

The modified powder was pressed into green disks and fired in a box type furnace as set forth in Example 1 except that, in the case of Examples 22–24 and Examples 28–30, the firing was done at 1523° K.(1250° C.) instead of 1598° K.(1325° C.) to prevent bonding of the samples and the surrounding powder into an inseparable mass. The density of a typical specimen disk of each example composition is also shown in Table VII.

EXAMPLE 31

In this example a modified lead zirconate titanate powder was prepared to produce the predetermined composition $Pb_{0.94}Ca_{0.05}Mg_{0.01}(Zr_{0.52}Ti_{0.48})O_3$.

Specifically, the procedure used in this Example was the same as that set forth in Example 1 except that 121.58 grams of $TiO_2$, 203.12 grams of $ZrO_2$, 15.86 grams of $CaCO_3$ and 1.85 grams of $Mg(OH)_2$ were admixed, and the resulting mixture was admixed with 678.42 grams of PbO.

Wet chemical analysis of the modified LZT powder produced revealed that only 1/37 of the Ca and 1/3.8 of the Mg indicated by the predetermined stoichiometric composition formula were present in the powder. These contents of Ca and Mg must then represent about the solubility limits of these elements in stoichiometric LZT having a Zr/Ti ratio of 0.52/0.48.

EXAMPLE 32

In this example a modified lead zirconate titanate powder was prepared to produce the predetermined composition $Pb(Zr_{0.52}Ti_{0.48})_{0.97}Fe_{0.01}Cr_{0.02}O_{2.985}$.

Specifically, the procedure used in this example was the same as that set forth in Example 1 except that 114.43 grams of $TiO_2$, 191.18 grams of $ZrO_2$, 2.46 grams of $Fe_2O_3$ and 4.68 grams of $Cr_2O_3$ were admixed, and the resulting mixture was admixed with 700.32 grams of PbO.

The modified powder was pressed into green disks and fired in a box type furnace as set forth in Example 1 except that the firing was for 3 hours at 1498°

EXAMPLE 33

In this example a modified lead zirconate titanate powder was prepared to produce the predetermined composition $Pb_{0.94}Ca_{0.05}Mg_{0.01}(Zr_{0.52}Ti_{0.48})_{0.97}Fe_{0.01}Cr_{0.02}O_{2.985}$.

Specifically, the procedure used in this example was the same as that set forth in Example 1 except that 118.11 grams of $TiO_2$, 197.33 grams of $ZrO_2$, 15.89 grams of $CaCO_3$, 1.85 grams of $Mg(OH)_2$, 2.54 grams of $Fe_2O_3$, and 4.83 grams of $Cr_2O_3$ were admixed, and the resulting mixture was admixed with 679.49 grams of PbO.

Wet chemical analysis of the modified LZT powder produced revealed that only 1/18.7 of the Ca and 1/3.2 of the Mg indicated by the predetermined stoichiometric composition formula were present in the powder. These contents of Ca and Mg must then represent about the solubility limits of these elements in stoichiometric LZT having a Zr to Ti ratio of 0.52 to 0.48 and also containing Fe and Cr in the amounts shown in the composition formula.

The modified powder was pressed into green disks and fired in a box type furnace as set forth in Example 1 except that the firing was for 3 hours at 1498° K.(1225° C.). Three fired disks had an average density of 7470 Kg/m³.

EXAMPLE 34

In this example a modified lead zirconate titanate powder was prepared to produce the predetermined composition $Pb_{0.994}Ca_{0.003}Mg_{0.003}(Zr_{0.52}Ti_{0.48})_{0.97}Fe_{0.01}Cr_{0.02}O_{0.2985}$.

Specifically, the procedure used in the example was the same as that set forth in Example 1 except that 114.88 grams of $TiO_2$, 191.94 grams of $ZrO_2$, 0.93 grams of $CaCO_3$, 0.54 grams of $Mg(OH)_2$, 2.46 grams of $Fe_2O_3$ and 4.69 grams of $Cr_2O_3$ were admixed, and the resulting mixture was admixed with 698.82 grams of PbO.

The modified powder was pressed into green disks and fired in a small tube furnace as set forth in Example 1 except that the firing was for 3 hours at 1498° K.(1225° C.). Five fired disks had an average density of 7840 Kg/m³.

EXAMPLE 35

In this example a modified lead zirconate titanate powder was prepared to produce the predetermined composition $Pb(Zr_{0.52}Ti_{0.48})_{0.98}Cr_{0.02}O_{2.99}$.

Specifically, the procedure used in this example was the same as that set forth in Example 1 except that 115.61 grams of $TiO_2$, 193.16 grams of $ZrO_2$, and 4.68 grams of $Cr_2O_3$ were admixed, and the resulting mixture was admixed with 700.78 grams of PbO.

The modified powder was pressed into green disks and fired in a small tube furnace as set forth in Example 1 except that the firing was for 3 hours at 1498° K.(1225° C.). Five fired disks had an average density of 7830 Kg/m³.

EXAMPLE 36

In this example a modified lead zirconate titanate powder was prepared to produce the predetermined stoichiometry $Pb(Ni_{0.333}Nb_{0.667})_{0.54}(Zr_{0.135}Ti_{0.325})O_3$.

Specifically, the procedure used in this example was the same as that set forth in Example 1 except that 79.39 grams of $TiO_2$, 50.86 grams of $ZrO_2$, 41.11 grams of NiO, and 146.28 grams of $Nb_2O_5$, were admixed, and the resulting mixture was admixed with 696.01 grams of PbO.

EXAMPLE 37

In this example a modified lead zirconate titanate powder was prepared to produce the predetermined composition $Pb_{0.92}La_{0.08}(Zr_{0.65}Ti_{0.35})_{0.98}O_3$.

Specifically, the procedure used in this example was the same as that set forth in Example 1 except that 84.52 grams of $TiO_2$, 242.06 grams of $ZrO_2$, and 40.9 grams of $La_2O_3$ and the resulting mixture was admixed with 645.90 grams of PbO.

In copending U.S. patent application Ser. No. 896,634 entitled "Molten Salt Synthesis Of Lead Zirconate Titanate Solid Solution Powder", filed of even date herewith in the names of Ronald Henry Arendt and Joseph Henry Rosolowski, and incorporated herein by reference, there is disclosed that sodium chloride and/or potassium chloride is added to an aqueous suspension of the oxides of lead, titanium and zirconium and stirred until the suspension converts to a gel which is then heated evaporating the water and melting said chloride in which the oxides dissolve and react precipitating lead zirconate titanate.

What is claimed is:

1. A process for incorporating modifying cation in $Pb(Zr_xTi_{1-x})O_3$ where x ranges from about 0.1 up to but less than 1 to produce modified lead zirconate titanate solid solution powder of predetermined composition having said modifying cation dissolved therein substituting for a portion of said Pb component and/or said $(Zr_xTi_{1-x})$ component in said $Pb(Zr_xTi_{1-x})O_3$, said dissolved modifying cation being selected from the group consisting of Sr, Fe, Nb, Sb, As, Bi, V, Ta, Ca, Mg, Ni, La, Cr and combinations thereof, said dissolved modifying cation ranging in amount up to the limit of its solid solubility in said modified lead zirconate titanate solid solution powder, which comprises providing particulate reactant oxides of zirconium, titanium, lead and cationic modifier in amounts formulated to give said modified solid solution powder of predetermined composition or particulate precursors for said reactant oxides, admixing said particulate oxides or precursors for said oxides with at least sufficient water with at least sufficient stirring to produce a suspension, adding to said stirred suspension a chloride salt in an amount of at least about 20% by weight of the total amount of said reactant oxides and said chloride salt, said chloride salt being selected from the group consisting of sodium chloride, potassium chloride and mixtures thereof, maintaining said stirring until the resulting suspension converts to a gel, heating said gel to a reaction temperature at least sufficient to melt said chloride salt, said precursor decomposing completely at or below said reaction temperature to form said reactant oxide and by-product gas, said salt in molten form being a solvent for said reactant oxides, maintaining said reaction temperature dissolving and reacting said reactant oxides in said molten salt and precipitating said modified lead zirconium titanate, and recovering said precipitated modified lead zirconate titanate by dissolving said chloride salt and separating said precipitated modified lead zirconate titanate from the resulting salt solution.

2. A process according to claim 1 wherein said amount of said oxide of lead is at least 1 weight % in excess of said amount formulated to give said modified solid solution powder of predetermined composition.

3. A process according to claim 1 wherein said reactant oxides or precursors therefor range in particle size from submicron up to about 25 microns.

4. A process according to claim 1 wherein said reactant oxides are mixed before being admixed with said water to form said suspension.

5. A process according to claim 1 wherein said chloride salt is a mixture comprised of 50 weight % sodium chloride and 50 weight % potassium chloride.

6. A process according to claim 5 wherein said reaction temperature ranges from 1173° K.(900° C.) to 1373° K.

7. A process according to claim 1 wherein said reaction temperature ranges from about 931° K. for the eutectic mixture of sodium chloride and potassium chloride up to below the melting point of said precipitated modified lead zirconate titanate.

* * * * *